(12) United States Patent
Bang et al.

(10) Patent No.: US 10,998,078 B2
(45) Date of Patent: May 4, 2021

(54) MEMORY SYSTEM AND METHOD OF OPERATING THE SAME

(71) Applicant: SK hynix Inc., Gyeonggi-do (KR)

(72) Inventors: Jae Hyuk Bang, Gyeonggi-do (KR); Dong Uk Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 96 days.

(21) Appl. No.: 15/970,298

(22) Filed: May 3, 2018

(65) Prior Publication Data
US 2019/0103169 A1     Apr. 4, 2019

(30) Foreign Application Priority Data

Sep. 29, 2017   (KR) ........................ 10-2017-0128032

(51) Int. Cl.
| | | |
|---|---|---|
| *G11C 29/42* | (2006.01) | |
| *G11C 16/10* | (2006.01) | |
| *G06F 11/10* | (2006.01) | |
| *G11C 16/26* | (2006.01) | |
| *G11C 16/08* | (2006.01) | |

(Continued)

(52) U.S. Cl.
CPC .......... *G11C 29/42* (2013.01); *G06F 11/1048* (2013.01); *G11C 16/08* (2013.01); *G11C 16/10* (2013.01); *G11C 16/26* (2013.01); *G11C 29/52* (2013.01)

(58) Field of Classification Search
CPC ......... G11C 29/42; G11C 16/08; G11C 16/10; G11C 16/26; G06F 11/1048
See application file for complete search history.

(56) References Cited

U.S. PATENT DOCUMENTS

| 8,566,671 B1* | 10/2013 | Ye ........................ G06F 11/1048 |
| | | 714/764 |
| 2003/0151950 A1* | 8/2003 | Tamada .............. G11C 11/5628 |
| | | 365/185.19 |

(Continued)

FOREIGN PATENT DOCUMENTS

| KR | 1020130034522 | 4/2013 |
| KR | 1020170064834 | 6/2017 |

OTHER PUBLICATIONS

Huang et al., Error-Correcting Codes for Flash Coding, IEEE, vol. 57, Issue: 9, pp. 6097-6108 (Year: 2011).*

*Primary Examiner* — April Y Blair
*Assistant Examiner* — Dipakkumar B Gandhi
(74) *Attorney, Agent, or Firm* — IP & T Group LLP

(57) ABSTRACT

Provided herein may be a memory system and a method of operating the memory system. The memory system may include: a semiconductor memory device including a plurality of memory cells to be programmed to an erase state and a plurality of program state; and a controller configured to control the semiconductor memory device to perform a program operation or a read operation in response to a request of a host. The controller may control the semiconductor memory device such that when, after a first program operation of the program operation has been performed, a number of program fail bits of the plurality of memory cells is greater than a maximum allowed number of ECC bits, a second program operation is performed on selected memory cells of the plurality of memory cells.

17 Claims, 7 Drawing Sheets

(51) Int. Cl.
  *G11C 29/54* (2006.01)
  *G11C 29/52* (2006.01)

(56) References Cited

U.S. PATENT DOCUMENTS

| | | | | |
|---|---|---|---|---|
| 2003/0188251 | A1* | 10/2003 | Brown | G06F 11/1068 |
| | | | | 714/763 |
| 2007/0019473 | A1* | 1/2007 | Kim | G11C 16/30 |
| | | | | 365/185.18 |
| 2007/0217274 | A1* | 9/2007 | Nobukata | G11C 16/22 |
| | | | | 365/201 |
| 2009/0024904 | A1* | 1/2009 | Roohparvar | G06F 11/1068 |
| | | | | 714/773 |
| 2009/0237979 | A1* | 9/2009 | Mukai | G11C 7/18 |
| | | | | 365/148 |
| 2010/0107021 | A1* | 4/2010 | Nagadomi | G06F 11/1068 |
| | | | | 714/704 |
| 2010/0238725 | A1* | 9/2010 | Naruke | G11C 11/5628 |
| | | | | 365/185.03 |
| 2012/0033492 | A1* | 2/2012 | Chen | G11C 11/5628 |
| | | | | 365/185.03 |
| 2012/0269003 | A1* | 10/2012 | Kim | G11C 16/06 |
| | | | | 365/185.22 |
| 2014/0153338 | A1* | 6/2014 | Byeon | G11C 16/28 |
| | | | | 365/185.21 |
| 2018/0061494 | A1* | 3/2018 | Hwang | G06F 11/0706 |

* cited by examiner

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2017-0128032, filed on Sep. 29, 2017, which is incorporated herein by reference in its entirety.

BACKGROUND

1. Field of Invention

Various embodiments of the present disclosure generally relate to an electronic device. Particularly, the embodiments relate to a memory system and a method of operating the memory system.

2. Description of Related Art

Semiconductor memory devices are classified into a volatile memory device and a nonvolatile memory device.

The volatile memory device has high write and read speeds, but loses data stored therein when power is turned off. On the other hand, although read and write speeds are comparatively low, the nonvolatile memory device can retain data stored therein even when power supply is interrupted. Therefore, the nonvolatile memory device is used when there is the need for storing data which must be retained regardless of whether or not it is connected to a power supply. Representative examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type memory and a NAND type memory.

The flash memory has both advantages of a RAM in which data is programmable and erasable and advantages of a ROM in which data stored therein can be retained even when power is interrupted. Such a flash memory is widely used as a storage medium of portable electronic devices such as a digital camera, a personal digital assistant (PDA), and an MP3 player.

SUMMARY

Various embodiments of the present disclosure are directed to a memory system having improved reliability and performance in a read operation, and a method of operating the memory system.

An embodiment of the present disclosure may provide for a memory system including: a semiconductor memory device including a plurality of memory cells to be programmed to an erase state and a plurality of program state; and a controller configured to control the semiconductor memory device to perform a program operation or a read operation in response to a request of a host. The controller may control the semiconductor memory device such that when, after a first program operation of the program operation has been performed, a number of program fail bits of the plurality of memory cells is greater than a maximum allowed number of error correcting code (ECC) bits, a second program operation is performed on selected memory cells of the plurality of memory cells.

An embodiment of the present disclosure may provide for a memory system including: a semiconductor memory device including a plurality of memory cells to be programmed to an erase state and a plurality of program state; and a controller configured to control the semiconductor memory device to perform a first program operation, a second program operation, a program fail bit detection operation, or a read operation in response to a request of a host. The controller may control the semiconductor memory device such that when, after the first program operation has been performed, a number of program fail bits detected by performing the program fail bit detection operation is greater than a maximum allowed number of error correcting code (ECC) bits, a second program operation is performed on memory cells having a certain program state of the plurality of program states.

An embodiment of the present disclosure may provide for a method of operating a memory system, including: programming program data to a plurality of memory cells; performing a program fail bit detection operation on the plurality of memory cells; and selectively performing, when a number of program fail bits detected as a result of the program fail bit detection operation is greater than a maximum allowed number of error correcting code (ECC) bits, a re-program operation on memory cells having a certain program state of the plurality of memory cells.

DETAILED DESCRIPTION

Figure 1:
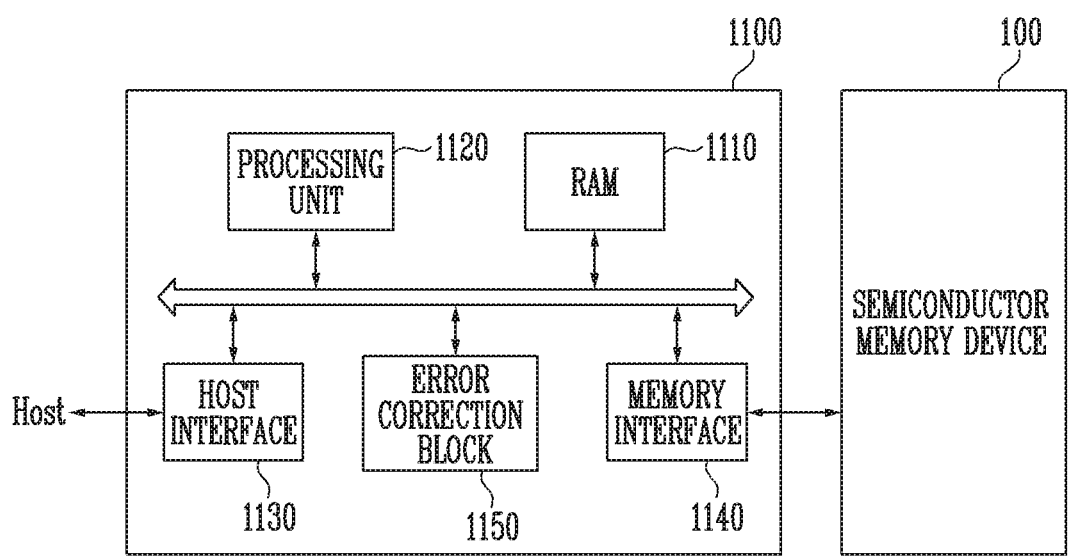
FIG. 1 is a block diagram illustrating a memory system in accordance with an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, the various embodiments of the present invention will be described in detail with reference to the attached drawings.

FIG. 1 is a block diagram illustrating a memory system 1000 in accordance with an embodiment of the present disclosure.

Referring to FIG. 1, the memory system 1000 may include a semiconductor memory device 100 and a controller 1100.

The controller 1100 is coupled to a host Host and the semiconductor memory device 100. The controller 1100 may access the semiconductor memory device 100 in response to a request from the host Host. For example, the controller 1100 may control a read operation, a write operation, an erase operation, and a background operation of the semiconductor memory device 100. The controller 1100 may provide an interface between the host Host and the semiconductor memory device 100. The controller 1100 may drive firmware for controlling the semiconductor memory device 100.

In an embodiment of the present disclosure, when the host Host inputs a write request, the controller 1100 may control the semiconductor memory device 100 to perform a first program operation, and thereafter, control the semiconductor memory device 100 to detect a program fail of a certain program bit by performing a program-fail-bit-detecting operation for the program operation. Here, when the number of detected program fail bits is equal to or less than the maximum allowed number of ECC bits, the controller 1100 controls the semiconductor memory device 100 to end the program operation. When the number of detected program fail bits is greater than the maximum allowed number of ECC bits, the controller 1100 controls the semiconductor memory device 100 to perform a second program operation in order to increase a threshold voltage distribution of a certain program state. In addition, after the second program operation has been performed, the controller 1100 may increase and reset a read voltage for the certain program state, and store the reset read voltage, and then control the semiconductor memory device 100 to perform a subsequent read operation using the reset read voltage. The certain program state may be at least one program state having a threshold voltage distribution adjacent to a threshold voltage distribution of an erase state.

The controller 1100 may include a random access memory (RAM) 1110, a processing unit 1120, a host interface 1130, a memory interface 1140, and an error correction block 1150.

The RAM 1110 may store the firmware therein and be used as an operating memory for the processing unit 1120, a cache memory between the semiconductor memory device 100 and the host Host, and a buffer memory between the semiconductor memory device 100 and the host Host. The firmware may include an algorithm for performing overall operations.

The processing unit 1120 may control the overall operations of the controller 1100, and control a program operation, a read operation, or an erase operation of the semiconductor memory device 100. In an embodiment of the present disclosure, the processing unit 1120 may control the program operation of the semiconductor memory device 100, and control the semiconductor device 100 such that the first program operation and the program-fail-bit-detecting operation have been performed. Based on the result of the program-fail-bit-detecting operation, the processing unit 1120 may control the semiconductor memory device 100 to end the program operation or perform the second program operation and then increase the read voltage. Furthermore, during a read operation, the processing unit 1120 may control the semiconductor memory device 100 to perform the read operation using the read voltage reset during the program operation.

The host interface 1130 may include a protocol for performing data exchange between the host Host and the controller 1100. In an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correction block 1150 may use an error correcting code (ECC) to detect and correct an error in data received from the semiconductor memory device 100. For example, the error correction block 1150 may compare the number of bits of the detected error with the maximum allowed number of ECC bits and correct the detected error when the number of bits of the detected error is less than the maximum allowed number of ECC bits.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMC-micro), a SD card (SD, miniSD, microSD, or SDHC), and a universal flash storage (UFS).

The controller 1100 and the semiconductor memory device 100 may be integrated into a single semiconductor device to form a solid state drive (SSD). The SSD may include a storage device configured to store data in a semiconductor memory. When the memory system 1000 is used as the SSD, the operating speed of the host Host coupled to the memory system 1000 may be greatly improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 2:
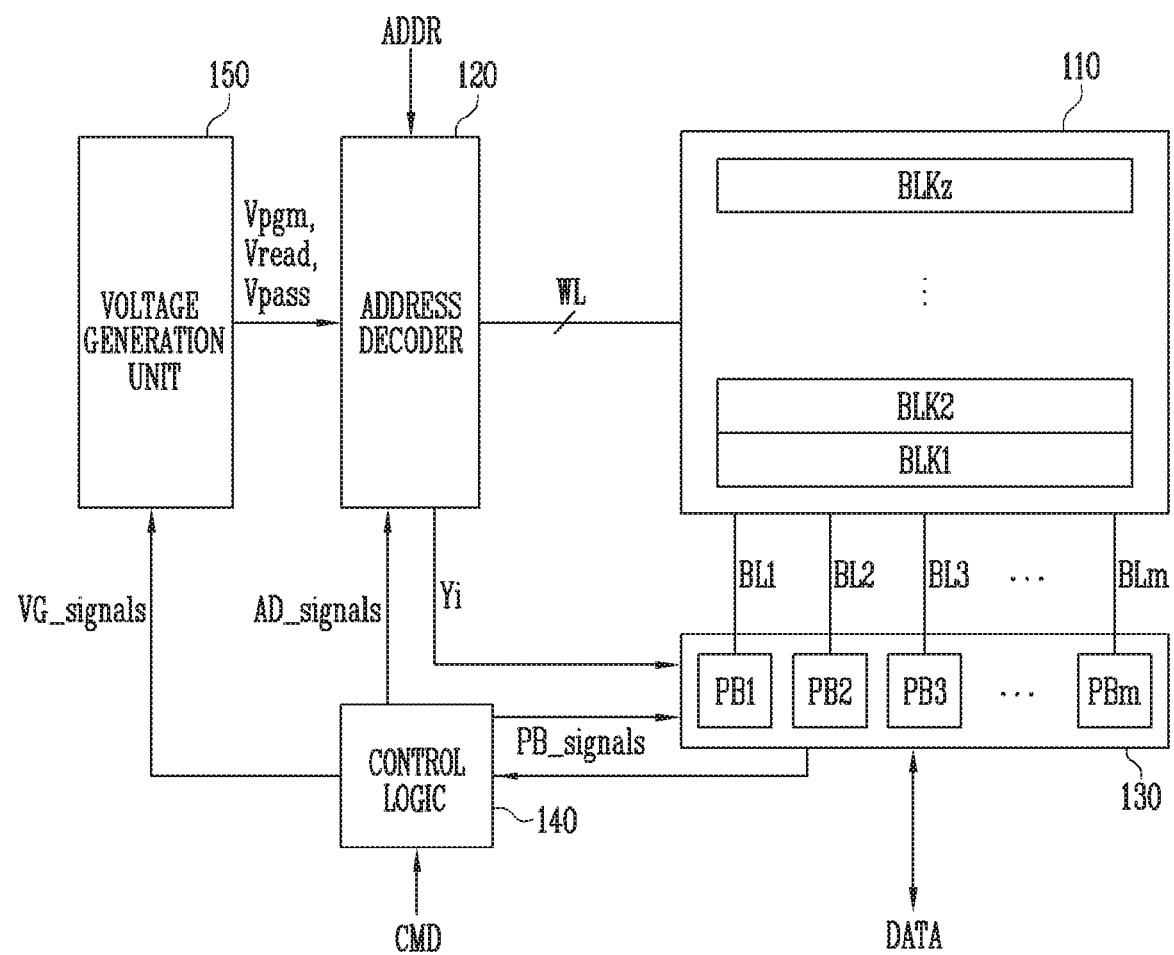
FIG. 2 is a block diagram illustrating a semiconductor memory device of FIG. 1.

FIG. 2 is a block diagram illustrating the semiconductor memory device 100 of FIG. 1.

Referring to FIG. 2, the semiconductor memory device 100 may include a memory cell array 110, an address decoder 120, a read/write circuit 130, a control logic 140, and a voltage generation unit 150.

The address decoder 120, the read/write circuit 130, and the voltage generation unit 150 may be defined as peripheral circuits configured to perform a read operation on the memory cell array 110.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read/write circuit 130 through bit lines BL1 to BLm. Each of the memory blocks BLK1 to BLKz may include a plurality of memory cells. In an embodiment, the memory cells may be nonvolatile memory cells, and in particular, the memory cells may be charge trap device-based nonvolatile memory cells. A plurality of memory cells, which are coupled in common to the same word line, may be defined as one page. The memory cell array 110 may include a plurality of pages. In addition, each of the memory blocks BLK1 to BLKz of the memory cell array 110 includes a plurality of strings. Each of the strings may include a drain select transistor, a plurality of memory cells, and a source select transistor which are coupled in series between a bit line and a source line.

The address decoder 120 is coupled to the memory cell array 110 through the word lines WL. The address decoder 120 may operate in response to control signals AD_signals output from the control logic 140. The address decoder 120 may receive addresses ADDR through an input/output buffer (not shown) provided in the semiconductor memory device 100.

The address decoder 120 may apply a program voltage Vpgm and a pass voltage Vpass which are generated by the voltage generation unit 150, to the word lines WL of the memory cell array 110 during a program operation, and may apply a read voltage Vread and a pass voltage Vpass which are generated by the voltage generation unit 150, to the word lines WL of the memory cell array 110 during a read operation.

The program operation or the read operation of the semiconductor memory device 100 may be performed on at least one memory block selected from among the memory blocks BLK1 to BLKz. The program operation or the read operation on the selected memory block may be performed on a page basis.

The addresses ADDR received in a request for the program operation or the read operation may include a block address, a row address, and a column address. The address decoder 120 may select one memory block and one word line in response to a block address and a row address. The column address Yi may be decoded by the address decoder 120 and provided to the read/write circuit 130.

The address decoder 120 may include a block decoder, a row decoder, a column decoder, an address buffer, etc.

The read/write circuit 130 may include a plurality of page buffers PB1 to PBm. The page buffers PB1 to PBm may be coupled to the memory cell array 110 through the bit lines BL1 to BLm. During a first program operation, each of the page buffers PB1 to PBm may temporarily store data DATA input through the controller 1100 of FIG. 1, and control the potential levels of a corresponding one of the bit lines BL1 to BLm in response to the temporarily stored data DATA. In other words, each of the page buffers PB1 to PBm may apply a program enable voltage (e.g., 0 V) or a program inhibit voltage (e.g., VCC) to a corresponding one of the bit lines BL1 to BLm in response to the temporarily stored data. During a second program operation, each of the page buffers PB1 to PBm may sense a program state of corresponding memory cells, and apply a program enable voltage (e.g., 0V) to a corresponding one of the bit lines BL1 to BLm when the sensed program state corresponds to a certain program state.

Here, during a read operation, each of the page buffers PB1 to PBm may sense a potential level or current of a corresponding one of the bit lines BL1 to BLm and perform the read operation.

The control logic 140 is coupled to the address decoder 120, the read/write circuit 130, and the voltage generation unit 150. The control logic 140 may receive a command CMD through an input/output buffer (not shown) of the semiconductor memory device 100. The control logic 140 may control the overall operation of the semiconductor memory device 100 in response to the command CMD.

When a command corresponding to a program operation is input from the controller 1100 of FIG. 1, the control logic 140 may control the address decoder 120, the read/write circuit 130, and the voltage generation unit 150 to perform the first program operation. Thereafter, the control logic 140 may control the address decoder 120, the read/write circuit 130, and the voltage generation unit 150 to perform a read operation for a program fail bit check operation. Furthermore, during the second program operation, the control logic 140 may control the address decoder 120, the read/write circuit 130, and the voltage generation unit 150 to perform a re-program operation for a certain program state. After the second program operation, the control logic 140 may control the address decoder 120, the read/write circuit 130, and the voltage generation unit 150 to increase and reset the read voltage corresponding to the certain program state and to use the reset read voltage during a read operation to be performed after the program operation has been completed.

The voltage generation unit 150 may operate in response to control signals VG_signals output from the control logic 140. For instance, the voltage generation unit 150 may generate and output a program voltage Vpgm and a pass voltage Vpass in response to control signals VG_signals during a program operation, and generate and output a read voltage Vread and a pass voltage Vpass in response to control signals VG_signals during a read operation.

Figure 3:
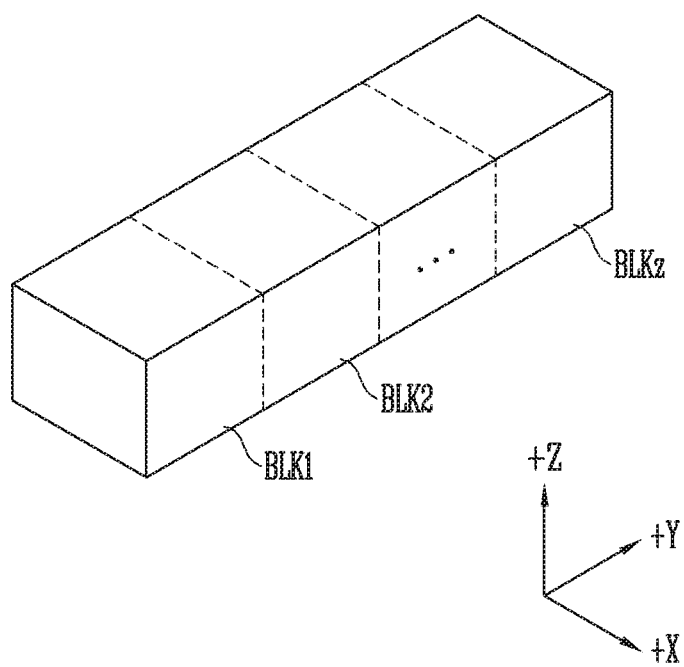
FIG. 3 is a block diagram illustrating an example of a memory cell array of FIG. 2.

FIG. 3 is a block diagram illustrating an example of the memory cell array 110 of FIG. 2.

Referring to FIG. 3, the memory cell array 110 may include the plurality of memory blocks BLK1 to BLKz. Each memory block may have a two-dimensional or a three-dimensional (3D) structure. Each memory block may include a plurality of memory cells stacked on a substrate. When the memory blocks have a 3D structure, as shown in FIG. 2, the memory cell array 110 may include a plurality of memory blocks BLK1 to BLKz each having a 3D structure (or vertical structure). The memory cells are arranged in a +X direction, a +Y direction, and a +Z direction. The structure of each memory block will be described in more detail with reference to FIGS. 3 and 4.

Figure 4:
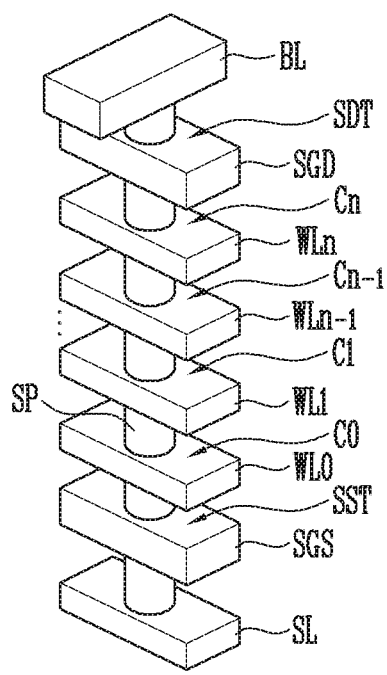
FIG. 4 is a three-dimensional (3D) diagram illustrating a memory string included in a memory block.
Figure 5:
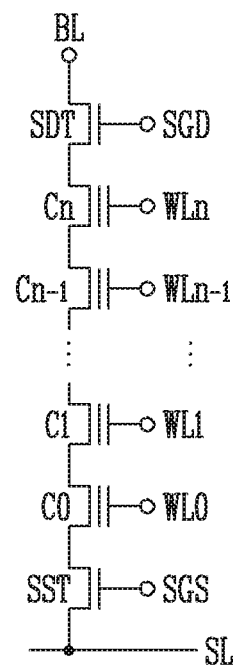
FIG. 5 is a circuit diagram illustrating the memory string shown in FIG. 4.

FIG. 4 is a three-dimensional diagram illustrating a memory string included in a memory block in accordance with an embodiment of the present disclosure. FIG. 5 is a circuit diagram illustrating the memory string.

Referring to FIGS. 4 and 5, a source line SL may be formed on a semiconductor substrate. A vertical channel layer SP may be formed on the source line SL. An upper portion of the vertical channel layer SP may be coupled to a corresponding bit line BL. The vertical channel layer SP may be made of polysilicon. A plurality of conductive layers SGS, WL0 to WLn, and SGD may be formed at different heights on the vertical channel layer SP in such a way that each of the conductive layers encloses the vertical channel layer SP. Multi-layers (not shown) including a charge storage layer may be formed on a surface of the vertical channel layer SP. The multi-layers may also be disposed between the vertical channel layer SP and the conductive layers SGS, WL0 to WLn, and SGD. The multi-layers may be formed in an ONO structure including an oxide layer, a nitride layer, and an oxide layer that are successively stacked.

A lowermost conductive layer may form a source select line (or a first select line) SGS. An uppermost conductive layer may form a drain select line (or a second select line) SGD. The conductive layers disposed between the select lines SGS and SGD may form the respective word lines WL0 to WLn. In other words, the conductive layers SGS, WL0 to WLn, and SGD may be formed in a multilayer structure on the semiconductor substrate. The vertical channel layer SP passing through the conductive layers SGS, WL0 to WLn, and SGD may be vertically coupled between the bit line BL and the source line SL formed on the semiconductor substrate.

The drain select transistor SDT may be formed on the portion of the uppermost conductive layer SGD that encloses the vertical channel layer SP. The source select transistor SST is formed on the portion of the lowermost conductive layer SGS that encloses the vertical channel layer SP. Memory cells C0 to Cn may be formed on the portions of the respective intermediate conductive layers WL0 to WLn that enclose the vertical channel layer SP.

In this way, the memory string may include the source select transistor SST, the memory cells C0 to Cn, and the drain select transistor SDT, which are vertically connected to the substrate between the source line SL and the bit line BL. The source select transistor SST may electrically couple the memory cells C0 to Cn to the source line SL in response to a first select signal applied to the first select line SGS. The drain select transistor SDT may electrically couple the memory cells C0 to Cn to the bit line BL in response to a second select signal applied to the second select line SGD.

Figure 6:
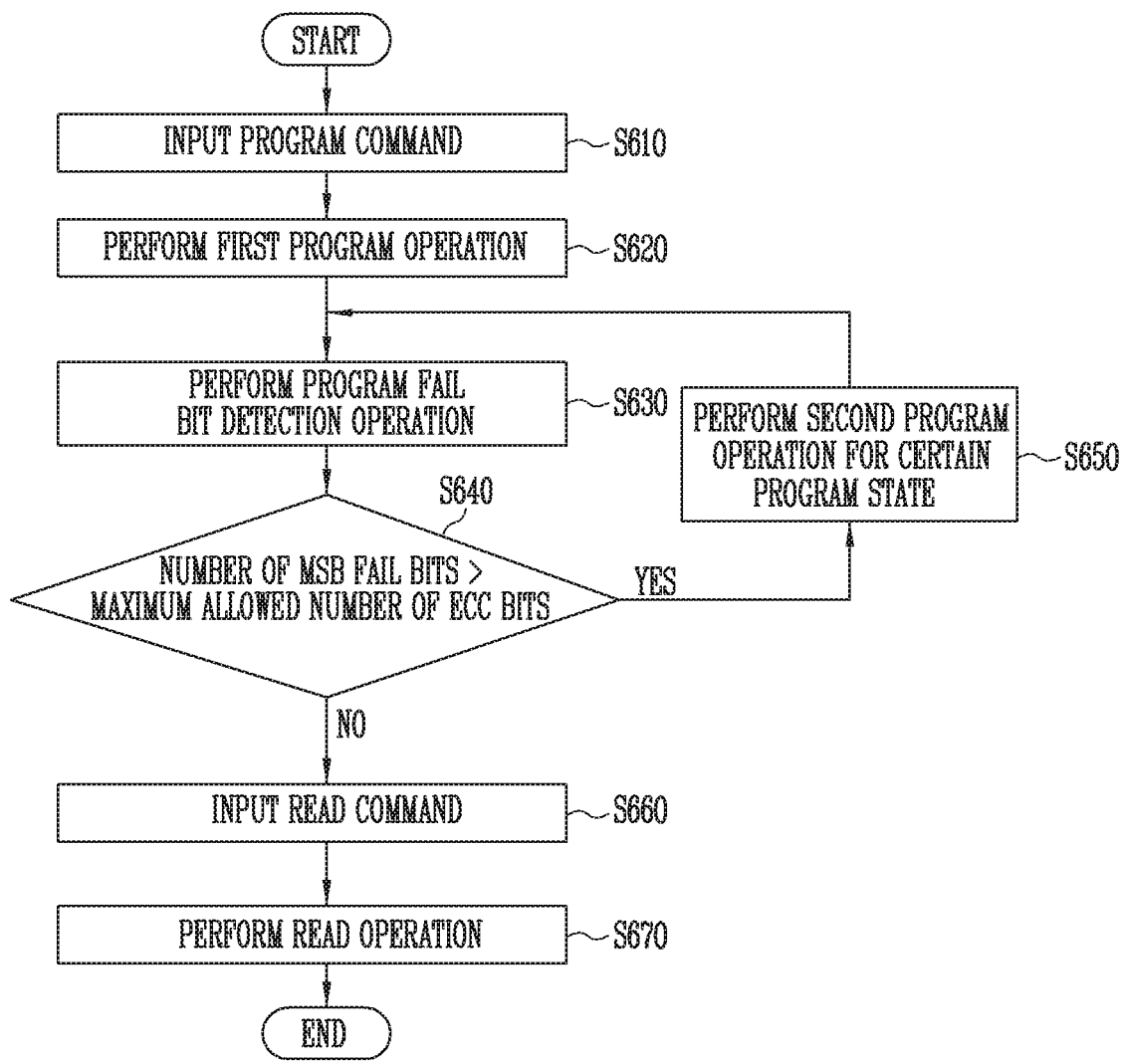
FIG. 6 is a flowchart describing a method of operating the memory system in accordance with an embodiment of the present disclosure.

FIG. 6 is a flowchart describing a method of operating the memory system in accordance with an embodiment of the present disclosure.

Figure 7:
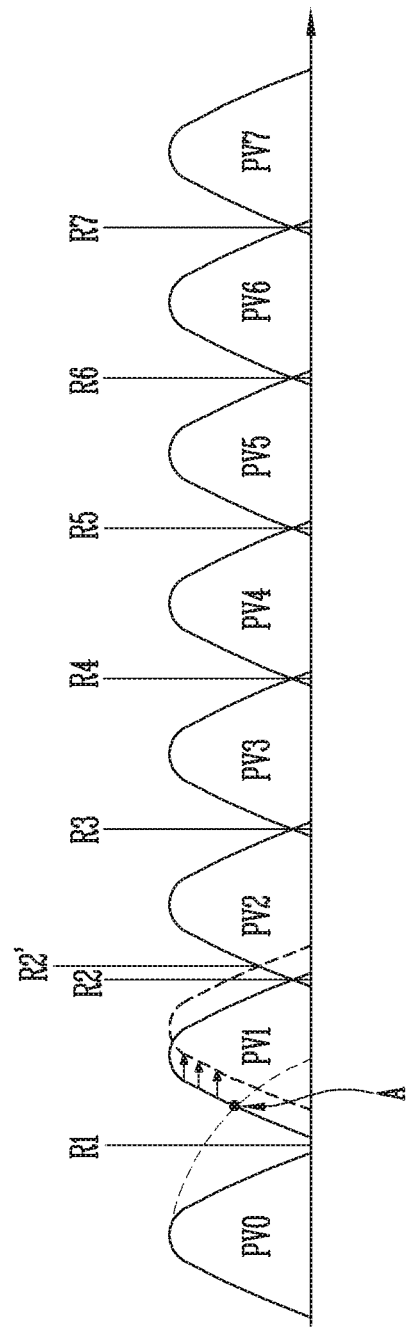
FIG. 7 is a diagram illustrating threshold voltage distributions of memory cells to describe the method of operating the memory system in accordance with an embodiment of the present disclosure.

FIG. 7 is a diagram illustrating threshold voltage distributions of memory cells to describe the method of operating the memory system in accordance with an embodiment of the present disclosure.

In describing the method of operating the semiconductor system in accordance with an embodiment of the present disclosure, references will be made to FIGS. 1 to 7.

In an embodiment of the present disclosure, a program operation of a triple level cell (TLC) capable of storing 3-bit data will be described for illustrative purposes.

At step S610, when a write request is input from the host Host, the controller 1100 generates a command CMD corresponding to a program operation and outputs the command CMD, along with data DATA to be programmed, to the semiconductor memory device 100.

At step S620, the control logic 140 of the semiconductor memory device 100 controls the peripheral circuits to perform a first program operation. The read/write circuit 130 temporarily stores the data DATA to be programmed and then adjusts the potential levels of the bit liens BL1 to BLm according to the temporarily stored data DATA. The voltage generation unit 150 generates and outputs a program voltage Vpgm and a pass voltage Vpass. To perform the first program operation, the address decoder 120 applies the program voltage Vpgm to a selected word line of a selected one of the memory blocks BLK1 to BLKz and applies the pass voltage Vpass to the other unselected word lines. In an embodiment, the first program operation may be performed according to an incremental step pulse program (ISPP) method.

When read operations are repeatedly performed on the memory block on which the first program operation has been completed, a threshold voltage distribution of memory cells having an erase state PV0 is increased by read stress, so that, as shown in FIG. 7, the threshold voltage distribution of the erase state PV0 overlaps a threshold voltage distribution of a first program state PV1, whereby at least A or more program fail bits may be generated. Here, if the number of program fail bits of the erase state PV0 and the first program state PV1 is greater than the maximum allowed number of ECC bits, the corresponding memory block may be processed as a bad block and thus may be disabled.

In an embodiment of the present disclosure, a second program operation may be selectively performed on the memory cell having the first program state PV1 to reduce a region in which the threshold voltage distribution of the erase state PV0 overlaps the threshold voltage distribution of the first program state PV1, thus solving the above-mentioned problem. In an embodiment of the present disclosure, the threshold voltage distribution of the first program state (PV1), which is the program state most adjacent to the erase state (PV0) may be increased to solve the above-mentioned problem. However, the threshold voltage distributions of at least one or more program states, e.g., the threshold voltage distributions of the first program state PV1 and the second program state PV2, adjacent to the erase state PV0, may be increased together.

The controller 1100 controls the semiconductor memory device 100 to perform a program-fail-bit-detecting operation after the first program operation has been completed, at step S630. The control logic 140 of the semiconductor memory device 100 controls the peripheral circuits to perform a read operation on a selected memory block during the program-fail-bit-detecting operation. The semiconductor memory device 100 outputs read data DATA to the controller 1100. The error correction block 1150 of the controller 1100 detects program fail bits between most significant bits (MSBs) and central significant bits (CSBs) of the read data DATA. The MSBs may be data bits read using read voltages R1 and R5. Based on the number of program failed MSBs, the number of program fail bits resulting from the overlapping of the threshold voltage distributions of the erase state PV0 and the first program state PV1 may be predicted. The CSBs may be data bits read using read voltages R2, R4, and R6. Based on the number of program failed CSBs, the number of program fail bits resulting from the overlapping of the threshold voltage distributions of the first and second program states PV1 and PV2 may be predicted. Furthermore, least significant bits (LSBs) may be data bits read using read voltages R3 and R7.

Based on the result of the program-fail-bit-detection operation, the number of program failed MSBs is compared with the maximum allowed number of ECC bits, at step S640.

When the number of program failed MSBs is greater than the maximum allowed number of ECC bits (that is, 'YES' at step S640), the controller 1100 controls the semiconductor memory device 100 to perform the second program operation on a certain program state (e.g., the first program state PV1), at step S650. The second program operation may be a re-program operation. During the second program operation, each of the page buffers PB1 to PBm may sense a program state of corresponding memory cells, and apply a program enable voltage (e.g., 0V) to a corresponding one of the bit lines BL1 to BLm when the sensed program state corresponds to the certain program state (i.e., the first program state PV1). Subsequently, the voltage generation unit 150 generates and outputs a program voltage Vpgm and a pass voltage Vpass. To perform the second program operation, the address decoder 120 applies the program voltage Vpgm to a selected word line of a selected one of the memory blocks BLK1 to BLKz and applies the pass voltage Vpass to the other unselected word lines. As a result of the second program operation, the threshold voltages of the memory cells of the first program state PV1 are increased, as shown in FIG. 7. Thereby, the region in which the threshold voltage distribution of the first program state PV1 overlaps the threshold voltage distribution of the erase state PV0 is reduced. Consequently, the number of program failed MSBs is reduced. Here, because the threshold voltages of the memory cells of the first program state PV1 are increased, the number of program fail bits related to the region in which the threshold voltage distributions of the first and second program states PV1 and PV2 overlap each other may be increased. If the second program operation is completed, the process is re-performed from the program-fail-bit-detection operation (step S630).

If the program-fail-bit-detection operation (step S630) is re-preformed after the second program operation (step S650) has been performed, the number of program failed MSBs is reduced and the number of program failed CSBs is increased. Here, when both of the number of program failed MSBs and the number of program failed CSBs are less than the maximum allowed number of ECC bits, the program operation is completed, and the control logic 140 increases the read voltage R1 and stores it as a new read voltage R1'.

When a read request is input from the host Host after the program operation has been completed, the controller 1100 generates a command CMD corresponding to a read operation and outputs the command CMD to the semiconductor memory device 100, at step S660.

The control logic 140 of the semiconductor memory device 100 controls the peripheral circuits to perform the read operation in response to the command CMD corresponding to the read operation, at step S670. The voltage generation unit 150 generates and outputs a read voltage Vread including the new read voltage R1' and a pass voltage Vpass. To perform the read operation, the address decoder 120 applies the read voltage Vread to a selected word line of a selected one of the memory blocks BLK1 to BLKz and applies the pass voltage Vpass to the remaining unselected word lines.

As described above, in embodiments of the present disclosure, during a program, of an erase state and a first program state in which program fail bits have occurred due to read stress, memory cells of the first program state are re-programmed so that the threshold voltage distribution of the memory cells is increased, whereby the number of program failed MSBs can be reduced to a value less than the maximum allowed number of ECC bits. Thereby, the number of program fail bits is reduced during a read operation. Consequently, the reliability of data may be improved.

In the embodiments of the present disclosure, an example in which the memory cells corresponding to only the first program state are re-programmed has been described, but the present disclosure is not limited thereto. For example, memory cells corresponding to any program state of which the number of program fail bits is relatively large may be re-programmed so that the threshold voltage distribution of the memory cells can be increased to reduce the number of corresponding program fail bits.

Figure 8:
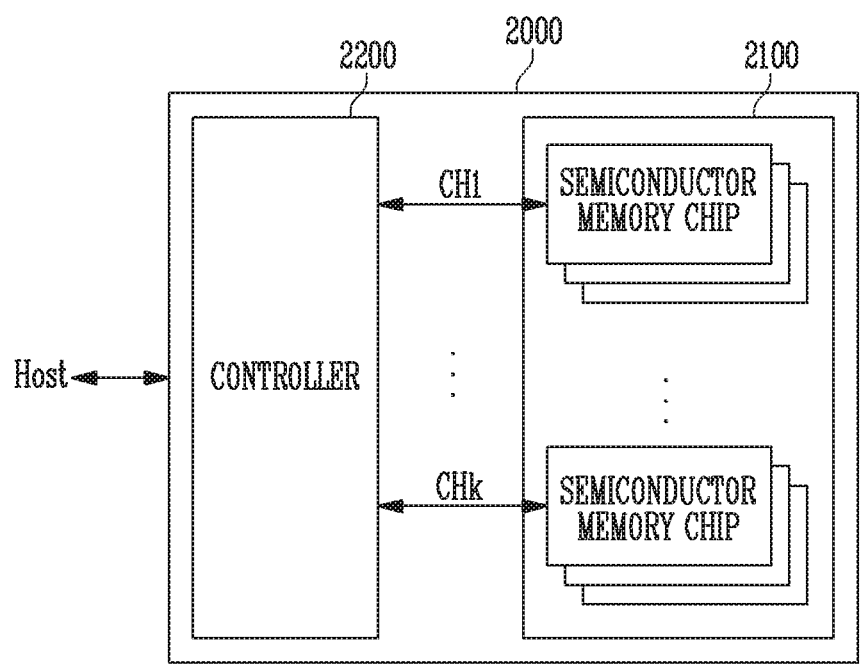
FIG. 8 is a block diagram illustrating an application example of the memory system of FIG. 1.

FIG. 8 is a block diagram illustrating an application example of the memory system of FIG. 1.

Referring FIG. 8, a memory system 2000 may include a semiconductor memory device 2100 and a controller 2200. The semiconductor memory device 2100 may include a plurality of memory chips. The semiconductor memory chips may be divided into a plurality of groups.

In FIG. 8, it is illustrated that the plurality of groups respectively communicates with the controller 2200 through first to k-th channels CH1 to CHk. Each semiconductor memory chip may have the same configuration and operation as those of an embodiment of the semiconductor memory device 100 described with reference to FIG. 2.

Each group may communicate with the controller 2200 through one common channel. The controller 2200 has the same configuration as that of the controller 1100 described with reference to FIG. 1 and may control a plurality of memory chips of the semiconductor memory device 2100 through the plurality of channels CH1 to CHk.

Figure 9:
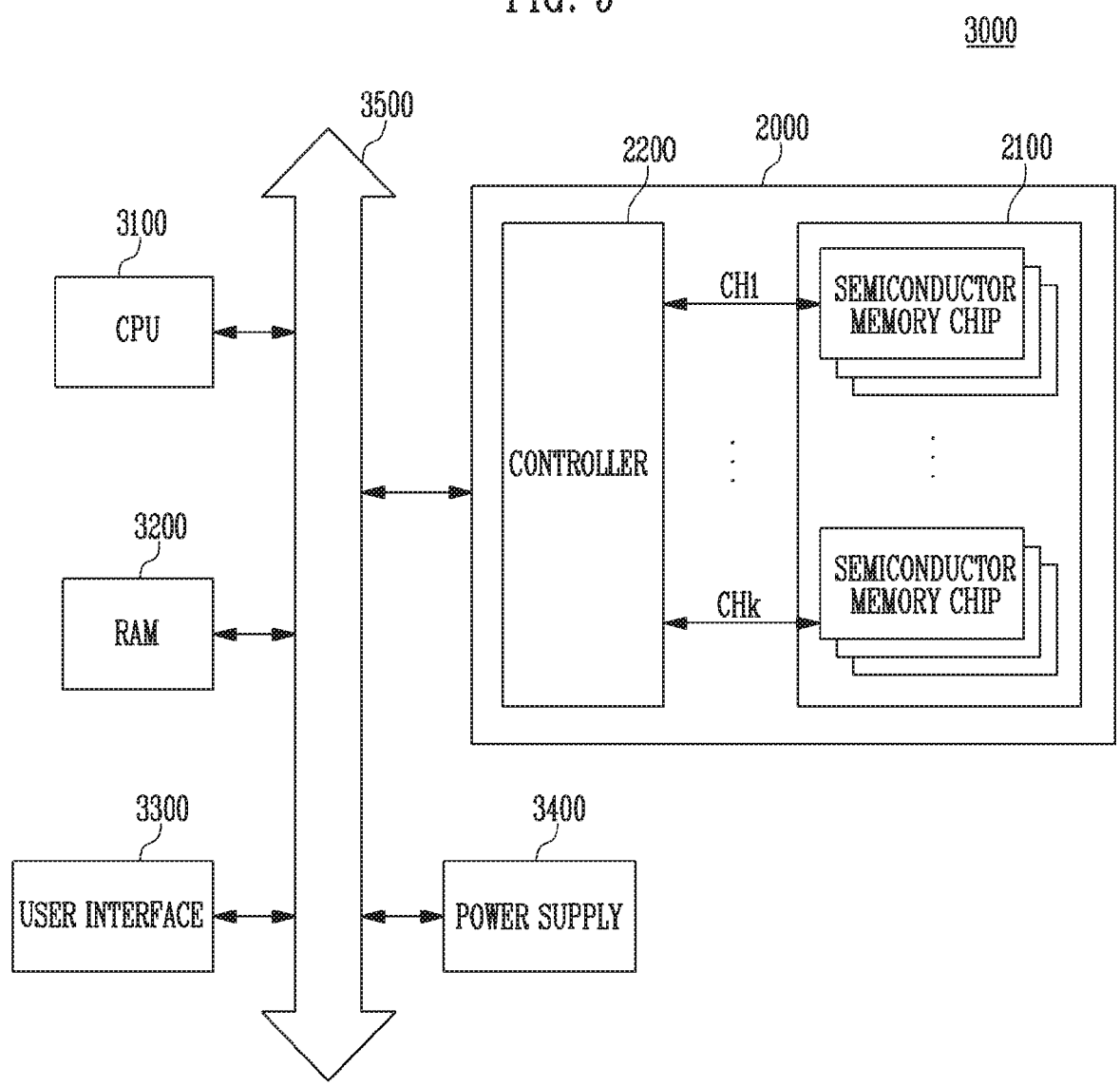
FIG. 9 is a block diagram illustrating a computing system including the memory system described with reference to FIG. 8.

FIG. 9 is a block diagram illustrating a computing system 3000 including the memory system 2000 described with reference to FIG. 8.

Referring to FIG. 9, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 9, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 9, the memory system 2000 described with reference to FIG. 8 may be provided. In an embodiment, the memory system 2000 may be replaced with the memory system 1000 described with reference to FIG. 1. In an embodiment, the computing system 3000 may be formed of the memory systems 1000 and 2000 described with reference to FIGS. 1 and 8.

In various embodiments of the present disclosure, when, after a program operation has been completed, the number of failures of a set program state is greater than a reference value, the set program state is re-programmed, whereby the reliability of a read operation may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising: a semiconductor memory device including a plurality of memory blocks each including a plurality of memory cells to be programmed to an erase state and a plurality of program states; and a controller configured to control the semiconductor memory device to perform a program operation or a read operation on a selected memory block, among the plurality of memory blocks, in response to a request of a host, wherein the controller controls the semiconductor memory device such that when, after a first program operation of the program operation on the selected memory block has been performed, a number of program fail bits of the plurality of memory cells of the selected memory block is greater than a maximum allowed number of error correcting code (ECC) bits, a second program operation is performed selectively on memory cells programmed to a first program state of the plurality of program states, among the plurality of memory cells of the selected memory block on which the first program operation has been performed, wherein a threshold voltage distribution of the first program state is most adjacent to a threshold voltage distribution of the erase state.

2. The memory system according to claim 1, wherein the controller comprises:
a processing unit configured to control the semiconductor memory device to perform the first program operation, a program-fail-bit-detection operation, the second program operation, and the read operation; and
an error correction block configured to receive, during the program-fail-bit-detection operation, data read from the semiconductor memory device and detect the number of program fail bits, and to compare the number of program fail bits with the maximum allowed number of ECC bits.

3. The memory system according to claim 2, wherein the error correction block detects a number of program fail bits of most significant bits (MSBs) of the read data, and compares the number of program failed MSBs with the maximum allowed number of ECC bits.

4. The memory system according to claim 1, wherein the second program operation is a re-program operation that increases threshold voltages of the memory cells programmed to the first program state.

5. The memory system according to claim 1, wherein the semiconductor memory device comprises:
a memory cell array including the plurality of memory cells;
a peripheral circuit configured to perform the first program operation, the second program operation, a program-fail-bit-detection operation, and the read operation on the memory cell array; and
a control logic configured to control the peripheral circuit.

6. The memory system according to claim 5, wherein, during the program-fail-bit-detection operation, the peripheral circuit reads data stored in the memory cell array and outputs the read data to the controller.

7. The memory system according to claim 5,
wherein the peripheral circuit comprises page buffers coupled to bit lines of the memory cell array, and
wherein, during the second program operation, each of the page buffers senses a program state of the plurality of memory cells, and applies a program enable voltage to a corresponding one of the bit lines when the sensed program state corresponds to the first program state.

8. The memory system according to claim 7, wherein, during the second program operation, the peripheral circuit selectively re-programs memory cells programmed to the first program state among the plurality of memory cells.

9. The memory system according to claim 1, wherein the controller controls the semiconductor memory device to increase and reset, after the second program operation has been performed, a read voltage to be used for reading the first program state, and store the reset read voltage, and to perform the read operation using the reset read voltage.

10. A memory system comprising: a semiconductor memory device including a plurality of memory blocks each including a plurality of memory cells to be programmed to an erase state and a plurality of program states; and a controller configured to control the semiconductor memory device to perform a first program operation, a second program operation, a program-fail-bit-detection operation, or a read operation on a selected memory block, among the plurality of memory blocks, in response to a request of a host, wherein the controller controls the semiconductor memory device such that when, after the first program operation on the selected memory block has been performed, a number of program fail bits detected by performing the program-fail-bit-detection operation on the selected memory block is greater than a maximum allowed number of error correcting code (ECC) bits, the second program operation is performed selectively on memory cells programmed to a first program state of the plurality of program states, among the plurality of memory cells of the selected memory block on which the first program operation has been performed, wherein a threshold voltage distribution of the first program state is most adjacent to a threshold voltage distribution of the erase state.

11. The memory system according to claim 10, wherein, during the second program operation, a threshold voltage distribution of the first program state is increased so that the number of program fail bits is reduced.

12. The memory system according to claim 10, wherein the controller comprises:
a processing unit configured to control the semiconductor memory device to perform the first program operation, the program-fail-bit-detection operation, the second program operation, and the read operation; and
an error correction block configured to receive, during the program-fail-bit-detection operation, data read from the semiconductor memory device and detect the number of program fail bits, and to compare the number of program fail bits with the maximum allowed number of ECC bits.

13. The memory system according to claim 12, wherein the error correction block detects a number of program fail bits of most significant bits (MSBs) of the read data, and compares the number of program failed MSBs with the maximum allowed number of ECC bits.

14. The memory system according to claim 10, wherein the controller controls the semiconductor memory device to increase and reset, after the second program operation has been performed, a read voltage to be used for reading the first program state, and store the reset read voltage, and to perform the read operation using the reset read voltage.

15. A method of operating a memory system, comprising:
programming program data to a plurality of memory cells included in a selected memory block among a plurality of memory blocks;
performing a program-fail-bit-detection operation on the plurality of memory cells of the selected memory block; and
performing, when a number of program fail bits detected as a result of the program-fail-bit-detection operation is greater than a maximum allowed number of error correcting code (ECC) bits, a re-program operation selectively on memory cells having a first program state, among the plurality of memory cells of the selected memory block programmed with the program data, the re-program operation selectively increasing a threshold voltage distribution,
wherein a threshold voltage distribution of the first program state is most adjacent to a threshold voltage distribution of an erase state.

16. The method according to claim 15, further comprising, after the re-program operation has been completed, increasing and resetting a read voltage to be used to read the first program state, and performing a read operation on the plurality of memory cells using the reset read voltage.

17. The method according to claim 15, wherein the number of program fail bits detected as the result of the program-fail-bit-detection operation is a number of program fail bits of most significant bits (MSBs) of data read from the plurality of memory cells.

* * * * *